(12) United States Patent
Ito

(10) Patent No.: US 11,911,829 B2
(45) Date of Patent: Feb. 27, 2024

(54) COATED TOOL AND CUTTING TOOL INCLUDING SAME

(71) Applicant: KYOCERA Corporation, Kyoto (JP)

(72) Inventor: Hirotoshi Ito, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 260 days.

(21) Appl. No.: 17/298,024

(22) PCT Filed: Nov. 27, 2019

(86) PCT No.: PCT/JP2019/046375
§ 371 (c)(1),
(2) Date: May 28, 2021

(87) PCT Pub. No.: WO2020/111123
PCT Pub. Date: Jun. 4, 2020

(65) Prior Publication Data
US 2022/0097146 A1    Mar. 31, 2022

(30) Foreign Application Priority Data

Nov. 29, 2018   (JP) .................... 2018-223526

(51) Int. Cl.
*B23B 27/14*    (2006.01)
*C23C 28/04*    (2006.01)

(52) U.S. Cl.
CPC .......... *B23B 27/148* (2013.01); *C23C 28/042* (2013.01); *C23C 28/044* (2013.01); *C23C 28/048* (2013.01); *B23B 2222/04* (2013.01); *B23B 2224/28* (2013.01);
(Continued)

(58) Field of Classification Search
CPC ... B23B 27/14; B23B 27/148; B23B 2222/04; B23B 2224/28; B23B 2224/32; B23B 2224/36; B23B 2228/105; C23C 16/34; C23C 16/32; C23C 16/36; C23C 16/403;
(Continued)

(56) References Cited

U.S. PATENT DOCUMENTS

| 2014/0193624 A1* | 7/2014 | Stiens | C23C 30/005 428/216 |
| 2015/0003925 A1* | 1/2015 | Ostlund | C23C 16/36 407/119 |
| 2016/0175940 A1* | 6/2016 | Lindahl | C23C 28/042 428/141 |

FOREIGN PATENT DOCUMENTS

JP    2006272515 A    10/2006
JP    5303732 B2    10/2013

* cited by examiner

*Primary Examiner* — Humera N. Sheikh
*Assistant Examiner* — Kevin C T Li
(74) *Attorney, Agent, or Firm* — HAUPTMAN HAM, LLP

(57) ABSTRACT

A coated tool includes a base and a coating layer located on the base. The coating layer includes a first layer having a thickness of 1 μm or more located near the base, and a second layer including $Al_2O_3$ particles which is in contact with the first layer and is located more away from the base than the first layer. A difference (A2−A1) between an erosion ratio A2 in the second layer and an erosion ratio A1 in the first layer is 0.60 to −0.30 μm/g. The erosion ratio is obtained by collision of a liquid A in which 3 mass % of spherical $Al_2O_3$ particles having a mean particle diameter of 1.1-1.3 μm is dispersed in pure water. A cutting tool includes a holder which includes a pocket, and the coated tool located in the pocket.

5 Claims, 3 Drawing Sheets

(52) U.S. Cl.
CPC ....... *B23B 2224/32* (2013.01); *B23B 2224/36* (2013.01); *B23B 2228/105* (2013.01)

(58) Field of Classification Search
CPC ..... C23C 28/04; C23C 28/042; C23C 28/044; C23C 28/048; C23C 30/005
See application file for complete search history.

COATED TOOL AND CUTTING TOOL INCLUDING SAME

RELATED APPLICATIONS

The present application is a National Phase of International Application No. PCT/JP2019/046375, filed Nov. 27, 2019, and claims priority based on Japanese Patent Application No. 2018-223526, filed Nov. 29, 2018.

TECHNICAL FIELD

The present disclosure relates to a coated tool including a coating layer on a surface of a base, and a cutting tool including the coated tool.

BACKGROUND

Coated tools, such as cutting tools with a coating layer, have been known in which a TiN layer, a TiCN layer and an $Al_2O_3$ layer are laminated one upon another on a surface of a base composed of cemented carbide, cermet, ceramics, or the like.

With improved efficiency in recent cutting processes, the cutting tools tend to be increasingly used in, for example, a heavy intermittent cutting process during which a cutting edge is subjected to a large impact. The large impact may be exerted on the coating layer under such severe cutting conditions, and the coating layer may be prone to chipping and peeling off. Hence, the coating layer needs improvement in terms of fracture resistance in addition to wear resistance.

As technology to improve the fracture resistance in the above cutting tools, Patent Document 1 may disclose that adhesion strength between a bonding film and an $Al_2O_3$ layer is enhanced to prevent peeling off of the coating layer by the following method. The method may include sequentially depositing the bonding film and the $Al_2O_3$ layer so that dendrites extended to a side of the $Al_2O_3$ layer and branched protrusions connecting to the dendrites are formed on the bonding film. Patent Document 1 may disclose that the dendrites are Ti(CO) or Ti(CNO), and the branched protrusions are (TiAl)(CNO). Patent Document 1 may describe that after forming the dendrites, a feed of a raw material gas is temporarily stopped, and the branched protrusions different from the dendrites in composition are formed by changing pressure and the kind of the raw material gas while holding a temperature.

RELATED ART DOCUMENTS

Patent Document

Patent Document 1: Japanese Patent No. 5303732

SUMMARY

A coated tool in the present disclosure includes a base and a coating layer located on the base. The coating layer includes a first layer having a thickness of 1 µm or more located near the base, and a second layer including $Al_2O_3$ particles which is in contact with the first layer and is located more away from the base than the first layer. A difference (A2−A1) between an erosion ratio A2 in the second layer and an erosion ratio A1 in the first layer is 0.60 to −0.30 µm/g. The erosion ratio is obtained by collision of a liquid A in which 3 mass % of spherical $Al_2O_3$ particles having a mean particle diameter of 1.1-1.3 µm is dispersed in pure water. A cutting tool in the present disclosure includes a holder which is extended from a first end toward a second end and includes a pocket on a side of the first end, and the coated tool located in the pocket.

EMBODIMENT

<Coated Tools>

Figure 1:
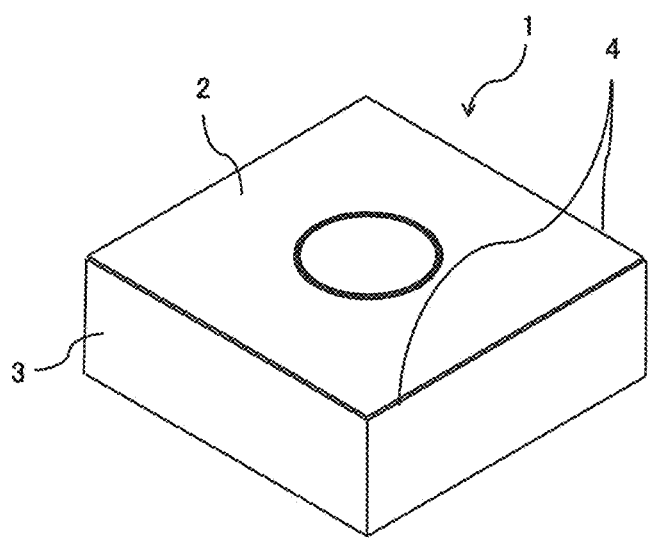
FIG. 1 is a schematic perspective view illustrating an embodiment of coated tools in the present disclosure.

In an embodiment illustrated in FIG. 1, a main surface of the coated tool in the present disclosure has an approximately quadrangular plate shape. However, there is no intention to limit to this shape. The coated tool 1 may include a first surface 2 (hereinafter referred to as a main surface 2), a second surface 3, and a cutting edge 4 located on at least a part of an intersection of the first surface 2 and the second surface 3. The first surface 2 is called as a rake surface, and the second surface 3 is called as a flank surface. It can also be said that the cutting edge 4 is located on at least the part of the intersection of the rake surface 2 and the flank surface 3.

Figure 2:
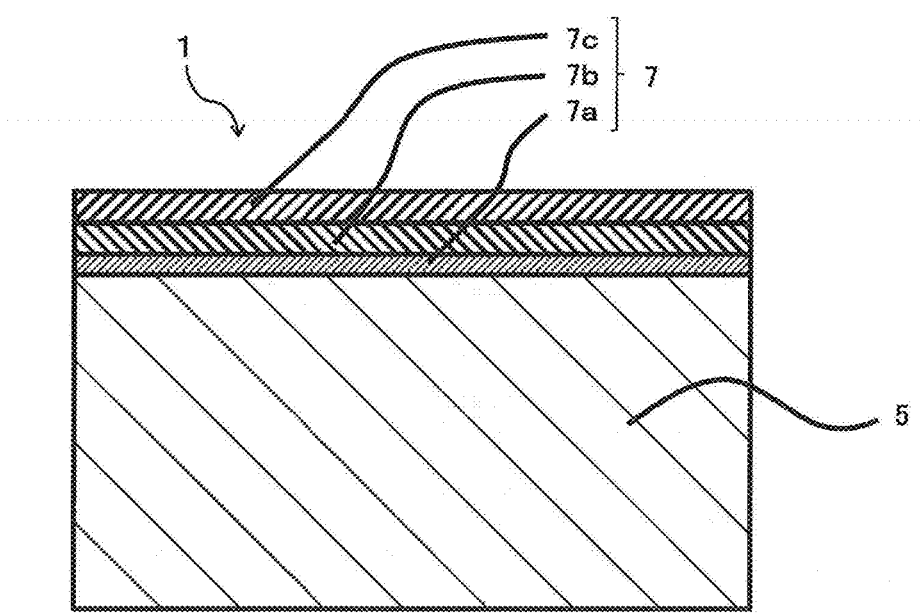
FIG. 2 is a schematic diagram for describing a configuration of a cross section of a coating layer in the coated tool in FIG. 1.

Referring to a schematic diagram of FIG. 2 illustrating a configuration of a cross section of a coating layer 7 in the coated tool 1, the coated tool 1 may include a base 5 and the coating layer 7 located on a surface of the base 5.

Examples of material constituting the base 5 of the coated tool 1 may include hard alloys, ceramics or metals. Examples of the hard alloys may include cemented carbides containing tungsten carbide (WC), and iron group metal such as cobalt (Co) or nickel (Ni). Other hard alloys may be Ti-based cermet containing titanium carbonitride (TiCN), and iron group metal such as cobalt (Co) or nickel (Ni). The ceramics may be $Si_3N_4$, $Al_2O_3$, diamond, or cubic boron nitride (cBN). The metals may be carbon steel, high-speed steel or alloy steel. Of these materials, cemented carbide or cermet is preferably used for the base 5 if used as the coated tool 1 in terms of fracture resistance and wear resistance.

The coating layer 7 includes a first layer 7a having a thickness of 1 µm or more located near the base 5, and a second layer 7b including $Al_2O_3$ particles which is located more away from the base 5 than the first layer 7a.

The coated tool 1 of the present disclosure has the above configuration and erosion ratios obtained by collision of a liquid A in which 3 mass % of spherical $Al_2O_3$ particles having a mean particle diameter of 1.1-1.3 µm is dispersed in 100 mass % of pure water. A difference (A2−A1) between an erosion ratio A2 in the second layer 7b and an erosion ratio A1 in the first layer 7a is 0.60 to −0.30 µm/g.

As used herein, the term "erosion ratio" denotes a value obtained by evaluating a depth of an inspection object removed by collision of the liquid A against the inspection object. Accordingly, a low erosion ratio indicates that the inspection object has enhanced wear resistance. In other words, the inspection object having the low erosion ratio is less prone to wear. The erosion ratio may be measured by collision of the liquid A against a surface of the object at approximately right angles and at a speed of 98-102 m/s.

An MSE tester "MSE-Al2O3" manufactured by Palmeso Co., Ltd. may be used to measure the erosion ratios.

In cases where the coating film 7 is a laminate film as in the coated tool 1 of the present disclosure, the second layer 7b located away from the base 5 may firstly become thinner due to wear. The wear may not occur uniformly, and a portion susceptible to wear and a portion unsusceptible to wear may be present. The second layer 7b may firstly disappear in the portion susceptible to wear, so that the first layer 7a may be exposed initially. A region therearound may include a portion where the second layer 7b remains. In other words, an interface between the first layer 7a and the second layer 7b may be present in exposed state around the portion where the first layer 7a is exposed.

In this state, the difference in erosion ratio between the first layer 7a and the second layer 7b is brought into the above range in the present disclosure. This makes it possible to reduce a sharp change in wear state, and the coated tool of the present disclosure therefore has enhanced peeling resistance.

Alternatively, an intermediate layer (not illustrated) of 1.0 µm or less may be located between the first layer 7a and the second layer 7b. Even in cases where the intermediate layer is located between the first layer 7a and the $Al_2O_3$ layer 7b, it may be said that the second layer 7b located in contact with the first layer 7a is disposed on the first layer 7a as long as the intermediate layer has a thickness of 1.0 µm or less.

Even in cases where the intermediate layer is a laminate of a first intermediate layer (not illustrated) and a second intermediate layer (not illustrated), the laminate may be regarded as the intermediate layer in the present disclosure if a total thickness thereof is 1 µm or less.

The erosion ratio A1 may be smaller than the erosion ratio A2. In other words, the first layer 7a may be less prone to wear than the second layer 7b. This configuration contributes to preventing a sharp wear of the first layer after the first layer is exposed.

The erosion ratio A2 may be 1.0-1.5 µm/g, and the erosion ratio A1 may be 0.7-1.2 µm/g. This configuration leads to further enhanced peeling resistance.

The first layer 7a may be, for example, a TiN layer including TiN particles, a TiC layer including TiC particles, a TiCN layer including TiCN particles, or a TiCNO layer including TiCNO particles. The second layer 7b may be, for example, an $Al_2O_3$ layer including $Al_2O_3$ particles, or a $ZrO_2$ layer including $ZrO_2$ particles.

The TiN layer, the TiC layer, the TiCN layer and the TiCNO layer denote ones whose main components are respectively TiN, TiC, TiCN and TiCNO. As used herein, the term "main components" denotes ones whose contents are 50 mass % or more among crystals included in the individual layers. These contents may be obtained by Rietveld analysis using X-ray diffraction.

The coating layer 7 may include a third layer 7c which is in contact with the second layer 7b and is located at a position more away from the base 5 than the second layer 7b. The third layer 7c may be a TiN layer including TiN particles, a TiC layer including TiC particles, or a TiCN layer including TiCN particles. A smooth chip discharge is attainable because the third layer 7c contributes to excellent wear resistance and fracture resistance and reduced friction. Alternatively, the third layer 7c may be an uppermost layer.

A difference (A3−A2) between an erosion ratio A3 in the third layer and the erosion ratio A2 in the second layer may be 0.0-2.0 µm/g.

The base 5 may be a so-called cemented carbide composed mainly of WC. The base 5 composed mainly of cBN or diamond may also be used.

Alternatively, an underlayer (not illustrated) composed of TiN may also be disposed between the base 5 and the first layer 7a. If the base 5 includes a component, such as Co, C (carbon) and W (tungsten), the underlayer serves to prevent these components from diffusing into a layer located on the underlayer. The underlayer may have a thickness of 0.1-1.0 µm.

Still alternatively, a TiCN and TiCNO layer (not illustrated) as an intermediate layer may be disposed between the first layer 7a and the second layer 7b. The intermediate layer may be one which includes intermediate layers. A thickness of each of these intermediate layers may be less than 1 µm.

Structures and thicknesses in the individual layers, and shapes of crystals constituting each of the layers are measurable by observing an electron micrograph (Scanning Electron Microscopy (SEM) photograph or Transmission Electron Microscopy (TEM) photograph) in a cross section of the coated tool 1.

The coated tool 1 is intended to carry out a cutting process by bringing a cutting edge formed on the intersection of the rake surface and the flank surface into contact with a workpiece, thereby offering the excellent effect. The coated tool 1 of the present disclosure is applicable to, besides the cutting tools, various kinds of uses, for example, wear resistant components such as sliding components and metal dies, digging tools, tools such as blades, and impact resistant components. Also in these cases, the coated tool 1 may offer excellent mechanical reliability.

An embodiment of a method for manufacturing the tool in the present disclosure is described below.

Firstly, a mixed powder is prepared by suitably adding metal powder, carbon powder or the like to an inorganic powder, such as carbide, nitride, carbonitride and oxide, which are capable of forming a hard alloy that becomes a base by sintering, and then by mixing them together. Subsequently, with a known molding method, such as press molding, casting molding, extrusion molding or cold isostatic pressing, the mixed powder is molded into a predetermined tool shape. The base is manufactured by sintering an obtained molded body in a vacuum or a non-oxidizing atmosphere. Thereafter, a surface of the base may be subjected to polishing process, and a cutting edge part may be subjected to honing process as needed.

Subsequently, a coating layer is deposited on the surface by chemical vapor deposition (CVD) method.

The first step is to deposit a TiN layer that is an underlayer by setting the base in a chamber. Deposition is carried out at a deposition temperature of 830° C. and a gas pressure of 8 kPa by using a reaction gas whose composition is 0.1-20 vol % of titanium tetrachloride ($TiCl_4$) gas, 20 vol % of nitrogen ($N_2$) gas, and the rest, namely, hydrogen ($H_2$) gas.

The next step is to deposit a first layer that is a TiCN layer. Deposition is carried out at a deposition temperature of 830° C. and a gas pressure of 9 kPa by using a reaction gas whose composition is 5.0-20 vol % of titanium tetrachloride ($TiCl_4$) gas, 10-90 vol % of nitrogen ($N_2$) gas, 0.3-3.0 vol % of acetonitrile ($CH_3CN$) gas, and the rest, namely, hydrogen ($H_2$) gas. By increasing a content ratio of acetonitrile ($CH_3CN$) gas at a late stage than an early stage during the deposition, an average crystal width of titanium carbonitride columnar crystals constituting the first TiCN layer can be made larger on a side of the surface than on a side of the base. The first layer has a thickness of 1 µm or more. The first layer may have a thickness of 3-20 µm.

The next step is to deposit a first intermediate layer that is a TiCN layer. Deposition is carried out at a deposition temperature of 950° C. and a gas pressure of 9 kPa by using a reaction gas whose composition is 10-20 vol % of titanium tetrachloride ($TiCl_4$) gas, 0.5-10 vol % of methane ($CH_4$) gas, 10-70 vol % of nitrogen ($N_2$) gas, and the rest, namely, hydrogen ($H_2$) gas. The first intermediate layer has a thickness of less than 1 μm.

The next step is to deposit a second intermediate layer that is a TiCNO layer. Deposition is carried out at a deposition temperature of 950° C. and a gas pressure of 9 kPa by using a reaction gas whose composition is 10-20 vol % of titanium tetrachloride ($TiCl_4$) gas, 0.5-10 vol % of methane ($CH_4$) gas, 10-20 vol % of nitrogen ($N_2$) gas, 0.1-3.0 vol % of carbon monoxide (CO) gas, and the rest, namely, hydrogen ($H_2$) gas. The second intermediate layer has a thickness of less than 1 μm. A total thickness of the first intermediate layer and the second intermediate layer is less than 1 μm.

Deposition of a second layer that is an $Al_2O_3$ layer is carried out at a deposition temperature of 980-1100° C. and a gas pressure of 5-20 kPa by using a reaction gas whose composition is 5-20 vol % of aluminum trichloride ($AlCl_3$) gas, 2-8 vol % of hydrogen chloride (HCl) gas, 3-8 vol % of carbon dioxide ($CO_2$) gas, 0.001-0.01 vol % of hydrogen sulfide ($H_2S$) gas, and the rest, namely, hydrogen ($H_2$) gas. The second layer may have a thickness of 1-15 μm.

Subsequently, deposition of a TiN layer, which is an uppermost layer and a third layer, is carried out at a deposition temperature of 1010° C. and a gas pressure of 10 kPa by using a reaction gas whose composition is 0.06-5 vol % of titanium tetrachloride ($TiCl_4$) gas, 10-30 vol % of nitrogen ($N_2$) gas, and the rest, namely, hydrogen ($H_2$) gas. The third layer may have a thickness of 0.1-2 μm.

Although the embodiment including the first intermediate layer, the second intermediate layer and the third layer has been discussed above, the first layer that is the TiCN layer, and the second layer that is the $Al_2O_3$ layer may be laminated directly on the surface of the base.

While the coated tools 1 of the present disclosure have been described, the present disclosure is not limited to the above embodiments, and various improvements and changes may be made without departing from the spirit and scope of the present disclosure.

<Cutting Tools>

A cutting tool of the present disclosure is described below with reference to the drawings.

Figure 3:
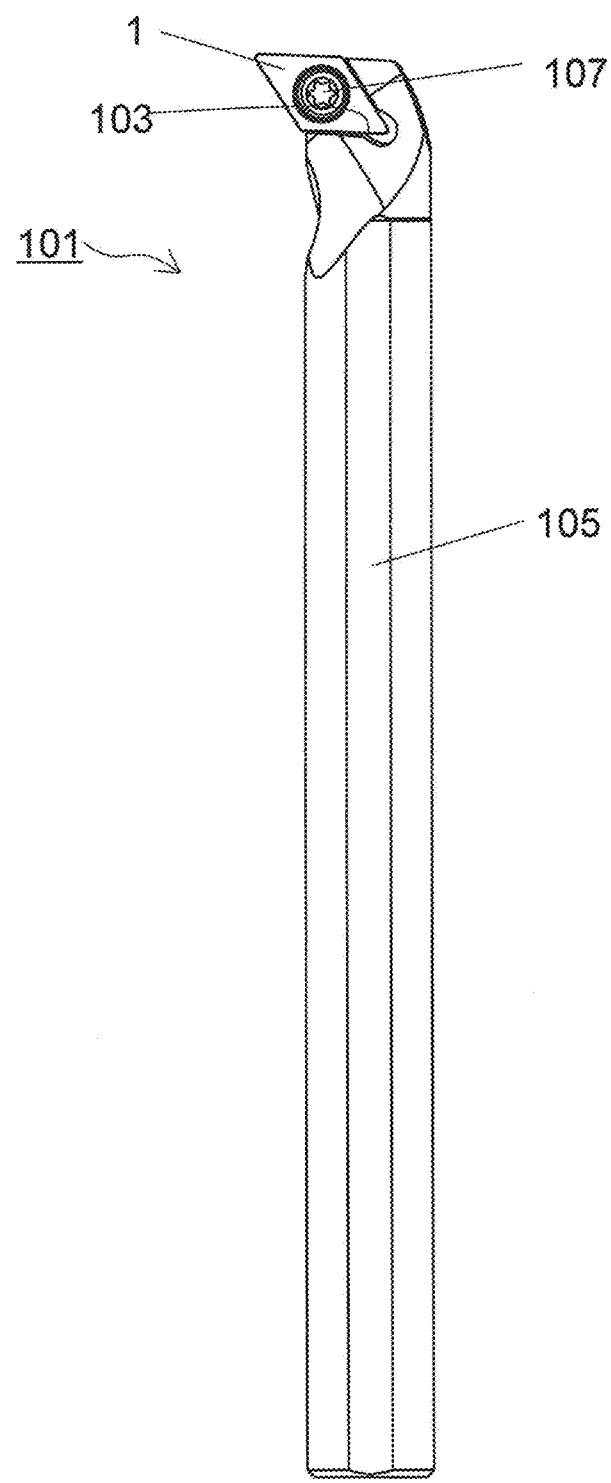
FIG. 3 is a plan view illustrating an embodiment of cutting tools in the present disclosure.

As illustrated in FIG. 3, the cutting tool 101 of the present disclosure is, for example, a bar-shaped body extended from a first end (an upper end in FIG. 3) toward a second end (a lower end in FIG. 3). As illustrated in FIG. 3, the cutting tool 101 includes a holder 105 with a pocket 103 located on a side of the first end (a tip), and the coated tool 1 located in the pocket 103. The cutting tool 101 includes the coated tool 1 and is therefore capable of carrying out a stable cutting process for a long period of time.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached to the holder 105 so that at least a part of a ridgeline where the first surface 2 intersects with the second surface 3, which is usable as the cutting edge 4, is protruded outward from the holder 105. The coated tool 1 is attached to the holder 105 by a screw 107 in the present embodiment. Specifically, the coated tool 1 is attached to the holder 105 in such a manner that screw parts are engaged with each other by inserting the screw 107 into the through hole of the coated tool 1, and by inserting a front end of the screw 107 into a screw hole (not illustrated) formed in the pocket 103.

For example, steel and cast iron are usable as a material of the holder 105. Of these materials, highly rigid steel may be used.

The present embodiment has illustrated and described the cutting tool 101 for use in the so-called turning process. Examples of the turning process include inner diameter processing, outer diameter processing and grooving process. The cutting tool 101 is not limited to one which is used for the turning process. For example, the coated tools 1 of the above embodiments may be used for cutting tools used in a cutting process by rolling.

EXAMPLES

Firstly, 6 mass % of metal cobalt powder having a mean particle diameter of 1.2 μm, 0.5 mass % of titanium carbide powder having a mean particle diameter of 2.0 μm, 5 mass % of niobium carbide powder having a mean particle diameter of 2.0 μm, and the rest, namely, tungsten carbide powder having a mean particle diameter of 1.5 μm were added and mixed together in their respective proportions. A mixture thus obtained was molded into a tool shape (CNMG120408) by press molding, followed by debinding and sintering in a vacuum at 1500° C. and 0.01 Pa for one hour, thereby manufacturing a base composed of cemented carbide. Thereafter, the manufactured base was subjected to brushing, and a part of the base, serving as a cutting edge, was subjected to round honing.

A coating layer was deposited on the base of the cemented carbide by chemical vapor deposition (CVD) method by combining individual deposition conditions presented in Table 1 as presented in Tables 2 and 3, thereby manufacturing a coated tool. The first intermediate layer being the TiCNO layer, and the second intermediate layer being the TiCN layer were sequentially deposited between the first layer and the second layer. The first intermediate layer had a thickness of 0.5 μm, and the second intermediate layer had a thickness of 0.1 μm.

In Table 1, T1 to T5 are deposition conditions of the TiCN layer, A1 to A5 are deposition conditions of the $Al_2O_3$ layer, and S1 to S3 are deposition conditions of the TiN layer.

In Table 1, individual compounds are expressed by chemical symbol. All first layers have a thickness of 6 μm. All second layers have a thickness of 4 μm. All third layers have a thickness of 0.5 μm.

All first layers presented in Table 2 are TiCN layers. All second layers presented in Table 2 are $Al_2O_3$ layers. All third layers presented in Table 3 are TiN layers.

In Table 1, individual raw material gases are expressed by chemical symbol, and occupation ratios of the individual raw material gases are indicated by vol %.

A first intermediate layer not presented in the tables was deposited at a deposition temperature of 950° C. and a gas pressure of 9 kPa by using a reaction gas whose composition was 15 vol % of titanium tetrachloride ($TiCl_4$) gas, 5 vol % of methane ($CH_4$) gas, 20 vol % of nitrogen ($N_2$) gas, and the rest, namely, hydrogen ($H_2$) gas.

A second intermediate layer 9 not presented in the tables was deposited at a deposition temperature of 950° C. and a gas pressure of 9 kPa by using a reaction gas whose composition was 15 vol % of titanium tetrachloride ($TiCl_4$) gas, 5 vol % of methane ($CH_4$) gas, 15 vol % of nitrogen ($N_2$) gas, 1.0 vol % of carbon monoxide (CO) gas, and the rest, namely, hydrogen ($H_2$) gas.

A SEM observation of a cross section including the coating layer in the above samples was carried out to measure a thickness of the individual layers. An erosion ratio (μm/g) of each of the layers was measured by collision of a liquid A in a direction at right angles to the coating layer at a speed of 100 m/s.

Subsequently, wear life of the obtained coated tools was evaluated by carrying out an intermittent cutting test under the following conditions. Test results are presented in Tables 2 and 3.

<Intermittent Cutting Conditions>
Workpiece: ductile cast iron, a sleeve member with four grooves (FCD700)
Tool Shape: CNMG120412
Cutting Speed: 200 m/min
Feed rate: 0.3 mm/rev
Depth of Cut: 1.5 mm
Others: Using water-soluble cutting fluid
Evaluation Item: Cutting time until occurrence of peeling or until a cutting edge falls down due to a sudden fracture

TABLE 1

| Type of layer | Deposition condition | | | | | | | | | | |
|---|---|---|---|---|---|---|---|---|---|---|---|
| | $TiCl_4$ | $CH_3CN$ | $CH_4$ | $H_2$ | $N_2$ | $AlCl_3$ | HCl | $CO_2$ | $H_2S$ | Ar | Temperature (° C.) | Pressure (hPa) |
| T1 | 14.71 | 1.26 | — | 63.03 | 21.01 | — | — | — | — | — | 870 | 90 |
| T2 | 16.55 | 0.71 | — | 70.92 | 11.82 | — | — | — | — | — | 850 | 90 |
| T3 | 18.87 | 0.27 | — | 80.86 | — | — | — | — | — | — | 825 | 90 |
| T4 | 14.29 | — | 4.08 | 61.22 | 20.41 | — | — | — | — | — | 1000 | 90 |
| T5 | 14.58 | — | 2.08 | 62.50 | 20.83 | — | — | — | — | — | 950 | 90 |
| A1 | — | — | — | 41.32 | — | 13.77 | 0.55 | 2.75 | 0.28 | 41.32 | 950 | 80 |
| A2 | — | — | — | 84.27 | — | 11.24 | 1.40 | 2.81 | 0.28 | — | 950 | 80 |
| A3 | — | — | — | 83.10 | — | 8.31 | 2.77 | 5.54 | 0.28 | — | 1000 | 90 |
| A4 | — | — | — | 78.74 | — | 7.87 | 5.25 | 7.87 | 0.26 | — | 1000 | 90 |
| A5 | — | — | — | 80.86 | — | 10.78 | 2.70 | 5.39 | 0.27 | — | 1010 | 90 |
| S1 | 6.25 | — | — | 72.92 | 20.83 | — | — | — | — | — | 1010 | 100 |
| S2 | 6.12 | — | 2.04 | 71.43 | 20.41 | — | — | — | — | — | 1010 | 150 |
| S3 | 8.82 | — | 2.94 | 88.24 | — | — | — | — | — | — | 1010 | 100 |

TABLE 2

| Sample No. | First layer | Second layer | Erosion ratio A1 of first layer | Erosion ratio A2 of second layer | Difference (A2 − A1) in erosion ratios | Wear test life time (min) |
|---|---|---|---|---|---|---|
| 1 | T1 | A1 | 1.01 | 0.22 | −0.79 | 12 |
| 2 | T1 | A2 | 0.92 | 0.39 | −0.53 | 10 |
| 3 | T1 | A3 | 0.95 | 0.49 | −0.46 | 12 |
| 4 | T1 | A4 | 1.05 | 1.11 | 0.06 | 32 |
| 5 | T1 | A5 | 1.01 | 2.21 | 1.2 | 14 |
| 6 | T2 | A1 | 1.72 | 0.28 | −1.44 | 15 |
| 7 | T2 | A2 | 1.79 | 0.39 | −1.4 | 15 |
| 8 | T2 | A3 | 1.77 | 0.52 | −1.25 | 11 |
| 9 | T2 | A4 | 1.69 | 1.42 | −0.27 | 27 |
| 10 | T2 | A5 | 1.75 | 2.34 | 0.59 | 24 |
| 11 | T3 | A1 | 4.32 | 0.19 | −4.13 | 5 |
| 12 | T3 | A2 | 4.13 | 0.37 | −3.76 | 5 |
| 13 | T3 | A3 | 4.22 | 0.55 | −3.67 | 5 |
| 14 | T3 | A4 | 4.21 | 1.21 | −3 | 9 |
| 15 | T3 | A5 | 4.14 | 2.03 | −2.11 | 10 |
| 16 | T4 | A1 | 3.21 | 0.29 | −2.92 | 10 |
| 17 | T4 | A2 | 3.38 | 0.38 | −3 | 5 |
| 18 | T4 | A3 | 3.28 | 0.61 | −2.67 | 5 |
| 19 | T4 | A4 | 3.33 | 1.31 | −2.02 | 9 |
| 20 | T4 | A5 | 3.41 | 2.02 | −1.39 | 14 |
| 21 | T5 | A1 | 5.12 | 0.29 | −4.83 | 5 |
| 22 | T5 | A2 | 5.13 | 0.39 | −4.74 | 5 |
| 23 | T5 | A3 | 5.07 | 0.55 | −4.52 | 5 |
| 24 | T5 | A4 | 5.01 | 1.17 | −3.84 | 7 |
| 25 | T5 | A5 | 5.01 | 2.01 | −3 | 7 |

TABLE 3

| Sample No. | First layer | Second layer | Third layer | Erosion ratio A3 of third layer | Difference (A3 − A2) in erosion ratios between second and third layers | Wear test life time (min) |
|---|---|---|---|---|---|---|
| 26 | T1 | A4 | S1 | 1.1 | 0.01 | 44 |
| 27 | T1 | A4 | S2 | 3.9 | 2.79 | 32 |
| 28 | T1 | A4 | S3 | 1.8 | 0.69 | 39 |

As presented in Table 2, Samples Nos. 4, 9 and 10, each being the coated tool of the present disclosure, were capable of reducing the occurrence of peeling and thus had a long life.

As presented in Table 3, Samples Nos. 26 and 28, in which the difference (A3−A2) between the erosion ratio A2 in the second layer and the erosion ratio A3 in the third layer was 0.0-2.0 μm/g, had a longer life.

The invention claimed is:

1. A coated tool, comprising:
a base; and
a coating layer located on the base, wherein
the coating layer comprises a first layer having a thickness of 1 μm or more located near the base, and a second layer comprising $Al_2O_3$ particles which is in contact with the first layer and is located more away from the base than the first layer, and
a difference (A2−A1) between an erosion rate A2 in the second layer and an erosion rate A1 in the first layer is 0.60 to −0.30 μm/g, wherein the erosion rate is obtained by collision of a liquid A in which 3 mass % of spherical $Al_2O_3$ particles having a mean particle diameter of 1.1-1.3 μm is dispersed in pure water.

2. The coated tool according to claim 1, wherein the erosion rate A1 is smaller than the erosion rate A2.

3. The coated tool according to claim 1, wherein the erosion rate A2 is 1.0-1.5 μm/g, and the erosion rate A1 is 0.7-1.2 μm/g.

4. The coated tool according claim 1, wherein the first layer comprises any one of TiN particles, TiC particles or TiCN particles.

5. The coated tool according to claim 1, wherein
the coating layer comprises a third layer which is in contact with the second layer and is located more away from the base than the second layer, and
a difference (A3−A2) between an erosion rate A3 in the third layer and the erosion rate A2 in the second layer is 0.0-2.0 μm/g.

\* \* \* \* \*